US008671366B2

(12) United States Patent
Tanaka et al.

(10) Patent No.: US 8,671,366 B2
(45) Date of Patent: Mar. 11, 2014

(54) ESTIMATING SHAPE BASED ON COMPARISON BETWEEN ACTUAL WAVEFORM AND LIBRARY IN LITHOGRAPHY PROCESS

(75) Inventors: Maki Tanaka, Yokohama (JP); Norio Hasegawa, Hinode (JP); Chie Shishido, Kawasaki (JP); Mayuka Osaki, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/390,354

(22) PCT Filed: Jul. 15, 2010

(86) PCT No.: PCT/JP2010/004589
§ 371 (c)(1),
(2), (4) Date: Feb. 14, 2012

(87) PCT Pub. No.: WO2011/021346
PCT Pub. Date: Feb. 24, 2011

(65) Prior Publication Data
US 2012/0151428 A1    Jun. 14, 2012

(30) Foreign Application Priority Data
Aug. 21, 2009    (JP) ................................. 2009-191567

(51) Int. Cl.
*G06F 17/50*    (2006.01)
(52) U.S. Cl.
USPC .................. 716/54; 716/52; 716/55; 716/112
(58) Field of Classification Search
USPC ....................................... 716/52, 54–55, 112
See application file for complete search history.

(56) References Cited

U.S. PATENT DOCUMENTS

| 6,909,930 | B2 * | 6/2005 | Shishido et al. ............... 700/121 |
| 7,273,685 | B2 * | 9/2007 | Sasazawa et al. ............... 430/30 |
| 7,685,560 | B2 * | 3/2010 | Nagatomo et al. .............. 716/51 |
| 7,771,905 | B2 * | 8/2010 | Sentoku et al. ................. 430/22 |
| 2003/0015660 | A1 | 1/2003 | Shishido et al. |
| 2004/0147121 | A1 * | 7/2004 | Nakagaki et al. ............. 438/689 |
| 2007/0187595 | A1 | 8/2007 | Tanaka et al. |
| 2012/0126116 | A1 * | 5/2012 | Tanaka et al. ................. 250/307 |

FOREIGN PATENT DOCUMENTS

| JP | 11-316115 A | 11/1999 |
| JP | 2003-173948 A | 6/2003 |
| JP | 2007-218711 A | 8/2007 |

OTHER PUBLICATIONS

Niu et al.; Specular Spectroscopic Scatterometry in DUV Lithography; IEEE Transactions on vol. 14, Issue: 2; 2001; pp. 97-106.*
Villarrubia et al., "Scanning electron microscope analog of scatterometry", Proceedings of SPIE, 2002, vol. 4689, pp. 304-312 (nine (9) sheets).

(Continued)

*Primary Examiner* — Naum Levin
(74) *Attorney, Agent, or Firm* — Crowell & Moring LLP

(57) ABSTRACT

The present invention aims at proposing a library creation method and a pattern shape estimation method in which it is possible, when estimating a shape based on comparison between an actual waveform and a library, to appropriately estimate the shape.

As an illustrative embodiment to achieve the object, there are proposed a method of selecting a pattern by referring to a library, a method of creating a library by use of pattern cross-sectional shapes calculated through an exposure process simulation in advance, and a method for selecting a pattern shape stored in the library.

4 Claims, 8 Drawing Sheets

(56) References Cited

OTHER PUBLICATIONS

Villarrubia et al., "A Simulation Study of Repeatability and Bias in the CD-SEM", Proceedings of SPIE, 2003, vol. 5038, pp. 138-149 (twelve (12) sheets).

Villarrubia et al., "Dimensional Metrology of Resist Lines using a SEM Model-Based Library Approach", Proceedings of SPIE, 2004, vol. 5375, pp. 199-209 (eleven (11) sheets).

International Search Report with English translation dated Aug. 24, 2010 (two (2) sheets).

* cited by examiner

FIG.3
(a)
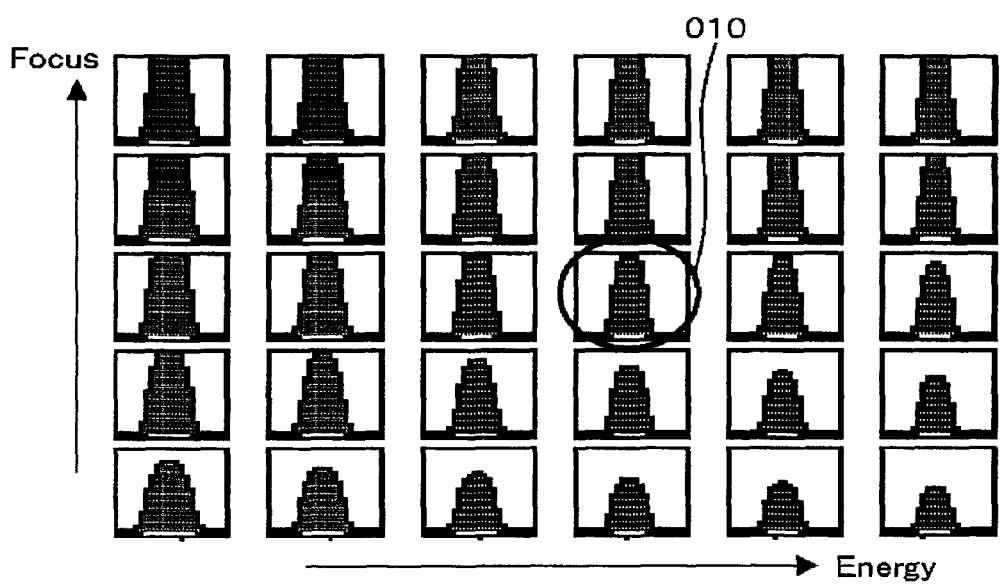
(b)
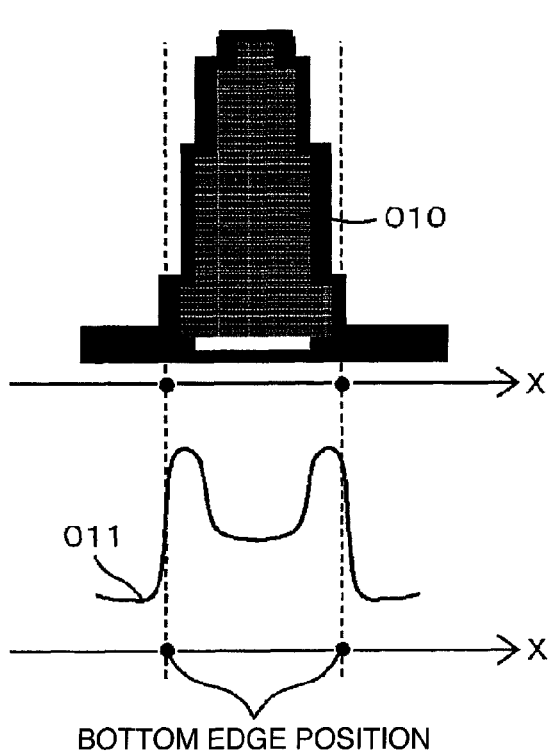
BOTTOM EDGE POSITION
(c)
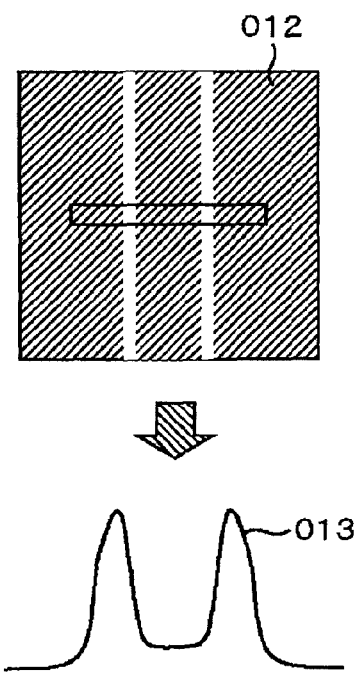

FIG.6
(a)
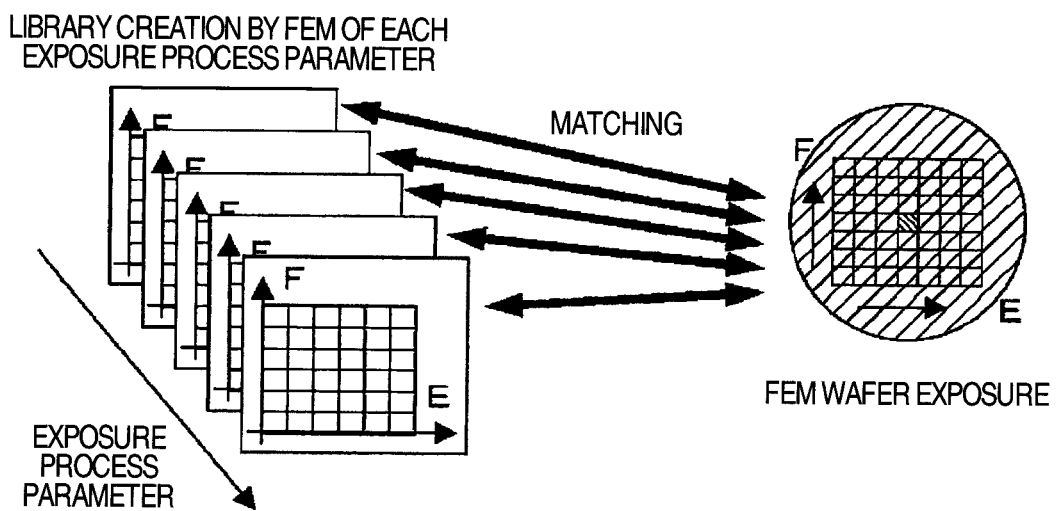
(b)
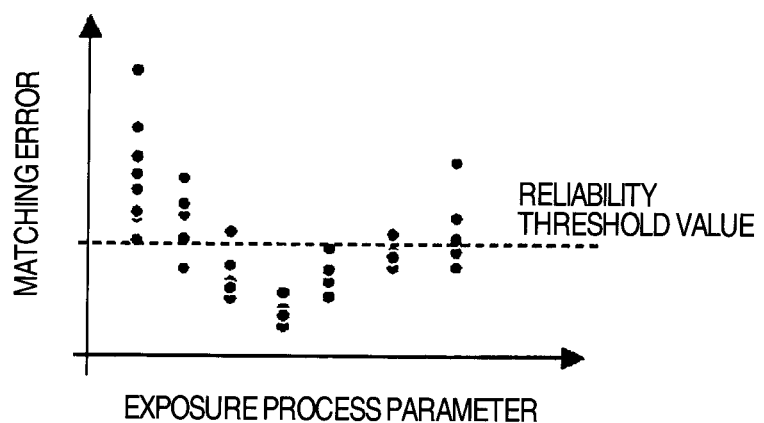

ESTIMATING SHAPE BASED ON COMPARISON BETWEEN ACTUAL WAVEFORM AND LIBRARY IN LITHOGRAPHY PROCESS

TECHNICAL FIELD

The present invention relates to a method of and a device for measuring dimensions of a pattern formed on a specimen, and in particular, to a method of and a device for estimating a shape or measuring dimensions of a pattern formed through a lithography process.

BACKGROUND ART

In the semiconductor wafer production process, patterns to be formed in many layers on a wafer are rapidly becoming finer; hence, the process monitor to monitor whether or not these patterns are formed on the wafer according to designs is increasingly important. Particularly, wiring patterns including transistor gate wiring are deeply associated with their line widths and device operation characteristics; hence, the monitoring of the wiring production process is especially important.

As a length measuring tool to measure the line width of fine wiring on the order of several tens of nanometers, there has been heretofore employed a scanning electron microscope (Critical dimension Scanning Electron Microscope (length measuring SEM)) to measure the line width, the microscope being capable of imaging lines with a magnification factor of several hundreds of thousands. Patent literature 1 describes an example of a length measuring process using such scanning electron microscope. Patent literature 1 discloses a scheme in which based on a local area in an image produced by imaging measurement target wiring, signal profiles of the wiring are added to each other in a longitudinal direction of the wiring to obtain an arithmetic mean to thereby create a projection profile; and the right and left wiring edges are detected in the profile to obtain the distance between the edges, to thereby calculate the wiring dimension.

However, as disclosed in non patent literature 1 (FIG. 1), as for an SEM signal waveform, it has been known that when a shape of the measurement target changes, the signal waveform also changes according thereto. As the semiconductor pattern becomes finer, these measuring errors increasingly affect the process monitor. Non patent literatures 1 and 2 disclose a scheme to reduce such measuring errors. According to the scheme, the relationship between a pattern shape and an SEM signal waveform is beforehand calculated through simulation; by use of its result, there is implemented high-precision measurement not depending on the shape of the target.

Specifically, according to the scheme disclosed in non patent literatures 1 and 2, the relationship between a pattern shape and an SEM signal waveform is beforehand calculated through SEM simulation, to implement, by use of the result, high-precision measurement not depending on the shape of the target. Non patent literatures 1, 2 and 3 disclose a scheme in which a pattern shape is represented by numeric values using parameters and SEM simulation results for various shapes are stored as a library; and the library is compared with an actual waveform, to thereby correctly estimate the shape and dimensions.

CITATION LIST

Patent Literature

PATENT LITERATURE 1: JP-A-11-316115

Non Patent Literature

NON PATENT LITERATURE 1: J. S. Villarrubia, A. E. Vladar, J. R. Lowney, and M. T. Postek, "Scanning electron microscope analog of scatterometry," Proc. SPIE 4689, pp. 304-312 (2002)

NON PATENT LITERATURE 2: J. S. Villarrubia, A. E. Vladar, M. T. Postek, "A simulation study of repeatability and bias in the CD-SEM," Proc. SPIE 5038, pp. 138-149, 2003.

NON PATENT LITERATURE 3: J. S. Villarrubia, A. E. Vladar, B. D. Bunday, M. Bishop, "Dimensional Metrology of Resist Lines using a SEM Model-Based Library Approach," Proc. SPIE 5375, pp. 199-209, 2004.

SUMMARY OF INVENTION

Technical Problem

When the library as described above is employed, it is possible, by using a charged particle beam device represented by the scanning electron microscope, to estimate a pattern shape based on an acquired signal waveform; however, when the number of types of parameters representing pattern shapes becomes greater, similar signal waveforms are obtained even for different pattern shapes; hence, the pattern shape cannot be uniquely determined in some cases. Also, as generally known, the resist pattern formed through an exposure process complicatedly varies in its cross-sectional shape due to variation in the focus of the exposure device. Non patent literature 3 above discloses a method of expressing the cross-sectional shape of the resist pattern using a sidewall inclination angle and a top-corner curvature; however, it is not possible for such simple shape model to sufficiently express the pattern shape change which may take place in the actual production process. Various shapes may be expressed by using more complex shape models, for example, by combining a plurality of trapezoids; however, this results in the problem of unstable matching due to the increased number of shape parameters.

In patent literature 1 as well as non patent literatures 1 and 2, such problem and the solution thereto have not been discussed at all.

Next, description will be given of a pattern shape selection method, a measuring method, and a charged particle beam device aiming at, in the estimation of a pattern shape based on comparison between an actual waveform and a library, estimating and measuring with high precision a shape of a resist pattern the shape of which is not easily expressed by shape parameters and which is formed through a lithography process. In addition, description will be given of a method and a device aiming at appropriately evaluating the exposure simulation employed to evaluate a lithography process.

Solution to Problem

As an illustrative embodiment to achieve the object above, there are proposed a method and a device for selecting a shape of a pattern by referring to a library with respect to an acquired waveform, and a method of conducting stable and high-precision estimation and measurement of a pattern cross-sectional shape by modeling pattern cross-sectional shapes at creation of a library by use of results of exposure process simulation.

Moreover, there is proposed, as another illustrative embodiment, a method of evaluating exposure simulation by use of a library.

Advantageous Effects of Invention

According to the illustrative embodiment above, by using results of the exposure process simulation, it is possible to employ a library including cross-sectional shapes similar to actual patterns; hence, it is possible to conduct stable and high-precision pattern shape selection, and the pattern shape estimation can be implemented with high precision.

Further, according to another illustrative embodiment described above, the exposure simulation can be appropriately evaluated.

BRIEF DESCRIPTION OF DRAWINGS

FIG. 3 is an explanatory diagram to explain library creation and SEM image waveform matching using exposure simulation.

FIG. 6 is an explanatory diagram to explain an exposure simulator evaluating and adjusting method using library matching results.

DESCRIPTION OF EMBODIMENTS

Figure 1:
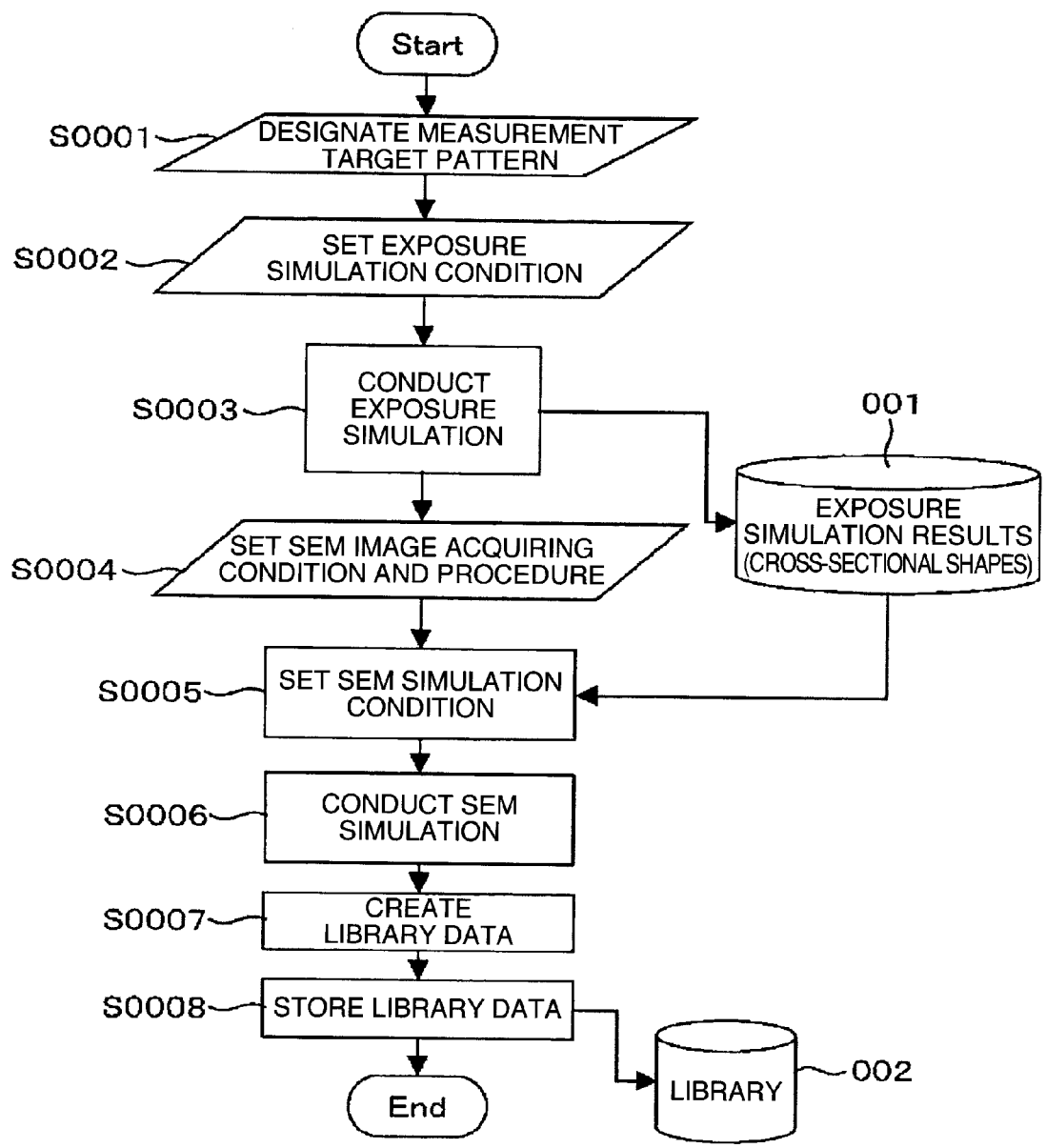
FIG. 1 is a flowchart to explain a process to create a pattern shape estimation library.

In the description below, an operation in which waveforms are registered for each pattern shape and pattern shape estimation and measurement are carried out based on actual measurement will be called a model-based measurement or library matching scheme. For this matching process with respect to the library, various nonlinear optimization schemes may be employed. However, in such estimation schemes, an appropriate result cannot be easily obtained if it is not possible to obtain stability for the solution.

As explained in M. Tanaka, J. S. Villarrubia and A. E. Vladar, "Influence of Focus Variation on Linewidth Measurements," Proc. SPIE 5752, pp. 144-155 (2005) and Tanaka, J. Meessen, C. Shishido et al., "CD bias reduction in CD-SEM linewidth measurements for advanced lithography," Proc. SPIE 6922, pp. 69221T-1-11 (2008), there exists a situation in which the solution cannot be uniquely determined in the library matching. The problem of the uniqueness of the solution in the matching is particularly conspicuous when pattern shape models are complex and when the number of parameters to be estimated is large. In such case, naturally, the library matching is not successfully conducted and the correct measurement results cannot be acquired.

To solve such problem, it is effective to correctly express, by using possibly a small number of parameter types, pattern shapes covering shape variations which may take place in patterns to be measured due to the production process variation and the like. In this regard, next, description will be given of a scheme in which the library is created using pattern shape models formed by use of exposure simulation to thereby improve precision of the library matching. The pattern shapes obtained through the exposure simulation cannot be easily expressed by simple shape parameters such as a sidewall inclination angle and a corner curvature; however, by expressing them by use of process parameters employed in the exposure simulation, for example, exposure energy quantity and an exposure focus value, it is possible to express a complex shape variation similar to an actual pattern by use of a small number of parameters.

In a first embodiment, the library is created by using results of the exposure process simulation as models of resist pattern cross-sectional shapes. The pattern cross-sectional shapes are expressed using exposure process parameters such as the exposure quantity and the focus, not parameters directly representing shapes. At measurement, an associated pattern shape in the library is selected via exposure process parameters, to measure the shape and dimensions of the target pattern; this is the method disclosed in the first embodiment.

In a second embodiment, there is disclosed a method in which the shape and the dimensions of the target pattern are measured by matching the library data of SEM waveforms created using the exposure process simulation with SEM signal waveforms obtained from actual patterns actually exposed by use of a plurality of known process parameters. Also, there is disclosed a method of conducting evaluation of the exposure simulation precision and adjustment of the parameters by evaluating the agreement degree between the estimated pattern shapes or exposure process parameters and the known exposure process parameters at pattern work described above.

In a third embodiment, there is disclosed another method of adjusting the exposure simulation parameters by evaluating the agreement degree between the estimated pattern shapes or exposure process parameters estimated through the matching between the library created using the exposure simulation results and the actual sample waveforms and the known exposure process parameters used at pattern work.

In a fourth embodiment, there is disclosed an example of a system most suitable for implementing first to third pattern measuring methods.

According to the schemes described above, the matching precision is improved in the model-based measuring scheme; as a result, the precision of the model-based measuring scheme itself is also improved. Further, the degree of difference between the exposure process simulation and the actual pattern can be quantitatively obtained through the matching; hence, it is possible to adjust the process parameters employed in the exposure simulator.

The schemes above are applicable to various charged particle beam devices (an SEM, an ion microscope, etc.); however, in the embodiments below, description will be given of an example in which an SEM is employed as a representative thereof Embodiment 1

For the first embodiment, description will be given of a basic illustrative embodiment of a pattern dimension measuring method using exposure process simulation by referring to FIGS. 1 to 4.

FIG. 1 shows a procedure to create a simulation library and a procedure to create an image acquiring recipe (a file having recorded a procedure for automatic image acquisition as a device task list).

First, a measurement target pattern is designated (step S0001). The pattern may be designated while actually observing a pattern by an SEM or by use of pattern design data. Next, there is set a condition required to execute an exposure process simulation reflecting an exposure process to create a resist pattern as the designated measurement target (step S0002). Although details will be described later, it is necessary to set a mask, a light source, a rest parameter, and the like for the exposure simulation. The mask kind, the layout, the resist, and the kind of the underlay reflection preventive film to be used in the exposure process are determined in the design stage in advance; hence, these values can be set when the measurement target pattern is determined. In an environment in which these design information data items are accessible, the flow of FIG. 1 may be automatically set based on the design data without any intervention of the operator. In this situation, to implement the measurement according to the basic condition required for the exposure process simulation as well as variations in the exposure condition, the simulation is conducted in consideration of the variation range of the measurement target production process. For example, pattern cross-sectional shapes are calculated under mutually different exposure conditions in advance by changing the energy quantity and the focus value employed at exposure. A set including patterns or data items obtained by changing the exposure energy quantity and focus value as above will be called a Focus-Exposure Matrix (to be referred to as FEM hereinbelow). The exposure process simulation will be described later in detail. Next, the exposure process simulation is executed (step S0003) to store pattern information as the simulation result.

Next, the operator sets an SEM image acquiring condition (electron beam radiation energy and current amount, a magnification factor, etc.) to be used for actual measurement by a length measuring SEM (step S0004). The SEM image acquiring condition may be set while actually viewing an image by the SEM; or, if there exists a general condition to measure an exposure pattern, the condition may be automatically set. Here, the image acquiring condition and procedure are recorded as a measurement recipe. Next, the operator sets a simulation condition to calculate an SEM image to be obtained under the SEM acquiring condition set in step S0004 (step S0005). It is only necessary that for the imaging condition parameter to be used in the simulation, the value set in step S0004 is employed and that for the material and shape information of the measurement target pattern, the material information set in the exposure simulation and the pattern information obtained as a result of the exposure simulation (step S0003) are used. Next, the SEM simulation of the SEM image creation process is executed (step S0006) to create library data based on results of the simulation (step S0007), to store the data as a simulation waveform library 002 (step S0008).

In a simulation library, SEM simulation waveforms calculated by setting pattern creation conditions or shapes to various values are stored with a relationship established between the waveforms and the shape information; the matching processing is executed to select, from these SEM simulation waveforms, a waveform having a shape most similar to an actual SEM image signal waveform; and based on the sample shape parameters and matching positions at calculation of the simulation waveforms, the shape and dimensions of the measurement target pattern are estimated. In the first embodiment, pattern cross-sectional shapes are created using exposure process simulation results, and the respective cross-sectional shapes are expressed by use of process condition parameters at exposure simulation execution, for example, the exposure energy and focus value, not the parameters (examples: the line width, the sidewall inclination angle, etc.) directly expressing cross-sectional shapes themselves. The library creation will be described later in detail. Through the procedure above, there are created recipes to acquire a plurality of SEM images to be used for measurement and a simulation library to be employed for the measurement.

Figure 2:
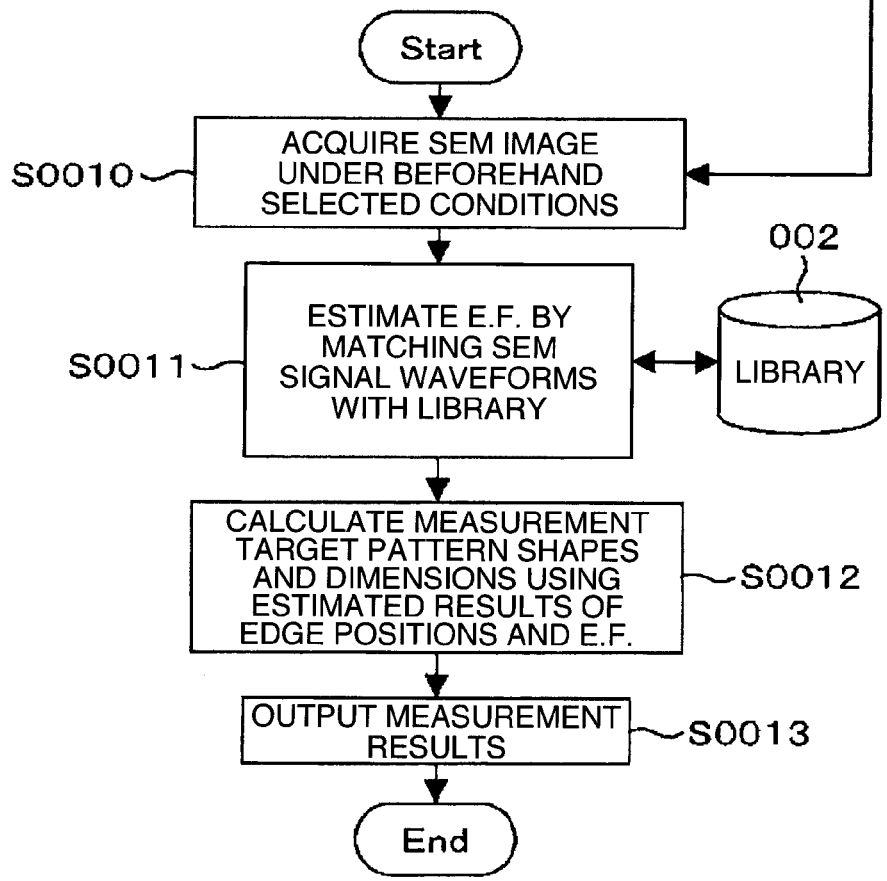
FIG. 2 is a flowchart to explain a process to estimate a pattern shape by referring, based on a produced SEM image, to the library.

Next, description will be given of an actual pattern measuring procedure by referring to FIG. 2. First, under an SEM image acquiring condition designated in advance in step S0004, an SEM image of the measurement target pattern is obtained. In the image acquisition, a semiconductor wafer with a measurement target pattern formed therein is first loaded in an SEM device 003, which will be described later; by conducting the alignment and the like in advance, an image at a desired measurement target pattern position is acquired by the SEM device 003 (step S0010). The SEM device 003 focuses an electron beam emitted from an electron gun and radiates the beam as a fine spot onto a sample surface.

By radiating the beam through two-dimensional scanning, it is possible to detect secondary electrons and reflected electrons emitted from respective positions and to store them as a digital image. Next, data matching is conducted between a set of the obtained SEM images and the simulation library created in the procedure shown in FIG. 1 (step S0011). In the matching processing, an SEM image is compared with an SEM simulation waveform to select a simulation result having the optimal agreement degree, to thereby estimate a shape and an edge position of the measurement target pattern. As described above, in the simulation library employed in the first embodiment, the pattern cross-sectional shapes are represented by the exposure energy quantity and focus values as exposure process parameters; hence, the matching results are also the exposure energy quantity and focus values.

Next, based on the matching results between the SEM images and the library, the pattern shape and the pattern dimensions desired by the user are calculated (step S0012). If the exposure energy quantity and focus value can be estimated in step S0011, the pattern cross-sectional shape and edge positions can be obtained based on the exposure simulation results. In the library data, the relationships between these cross-sectional shapes and the SEM signal waveforms is clearly represented; hence, by using these relationships, it is possible to correctly estimate the shape and dimensions of the measurement target pattern. Finally, the measurement results are outputted onto a screen and a file (step S0013).

Next, description will be given in detail of part of the processing procedure of FIGS. 1 and 2. Here, for simplicity, an example of a simple line structure pattern will be shown.

First, description will be given in detail of the exposure process simulation of step S0003. In the exposure process simulation, it is required to input information of a mask and an optical system (a mask kind, a layout, a light source, a lighting system, a projection lens condition, etc.), material information of a resist and an underlay reflection preventive film to be used (a resist sensitivity characteristic and the like), and various processing conditions after exposure. By using these information pieces, an aerial image (an image in the space) is calculated, and processes associated with the light intensity distribution in the resist material, the latent image post-exposure resist reaction, the bake after exposure (Post Exposure Bake: PEB), and the developing process are calculated based on models, to thereby calculate a pattern shape to be formed. If the parameters of the exposure simulator are fully adjusted, it is possible to appropriately calculate the resist pattern shape actually formed.

FIG. 3(a) shows an example of the exposure simulation results obtained in step S0003. By changing the exposure energy quantity and focus value in the calculation, there are obtained pattern cross-sectional shapes which vary according to the exposure energy and focus value as shown in FIG. 3. In general, these cross-sectional shapes are indicated as a polygon or the like using strings of points of coordinate data; and arbitrary shapes can be expressed. In this way, by using the exposure simulation results as shape models, the shapes which may actually exist can be correctly expressed; also, by expressing these shapes using exposure condition parameters, not using shape parameters, it is possible to express a complex shape using a small number of simple parameters. When the number of shape parameters for the estimation (in this embodiment, exposure condition parameters are employed in place thereof to express the shapes) is smaller, the library matching is more stably conducted at a higher speed.

Next, description will be given of a library creation method using resist pattern cross-sectional shapes acquired in the method described above. If the cross-sectional shape of FIG. 3(a), the material, and the SEM condition at acquisition of the image for measurement are determined, it is possible to simulate a signal waveform in a situation when the SEM image of the pattern having the given cross-sectional shape is produced. For the SEM image simulation, it is only necessary to employ a Monte Carlo simulation in which electron scattering, excitation, etc. in a solid are modeled. Incidentally, although not shown, both of the exposure process simulation and the SEM simulation are affected by adjacent patterns; hence, both thereof are conducted in consideration of the adjacent patterns.

FIG. 3(b) shows an example of a situation in which an SEM simulation is conducted for a result of a cross-sectional shape to thereby calculate a signal waveform. By using, for example, a cross-sectional shape 010 enclosed by a circle in FIG. 3(a) as an input, a signal waveform 011 can be calculated through the Monte Carlo simulation. In this situation, in the SEM simulation, a correspondence can be correctly established between the input cross-sectional shape and x-directional coordinates of the output signal waveform. For such data set, when an edge position, for example, a pattern bottom edge position is acquired from the cross-sectional data as the exposure simulation result to establish a correspondence thereof to the signal waveform in advance, it is possible to establish a correspondence between a part of the signal waveform and the bottom position of the actual pattern. Further, using the cross-sectional shape data, the line width at an arbitrary height can be calculated. When a height for the measurement is designated to store the value of the dimension at the height in the library together with the waveform data in advance, it is possible, by using the result of the waveform matching, to easily acquire the required dimension information. It is only necessary to calculate, for example, widths at the top, the bottom, and 50% height of the pattern.

Also, when an arbitrary cross-sectional shape represented by a coordinate data string is expressed by shape parameters such as the bottom width, the top width, the height, the sidewall inclination angle, and the corner curvature, it is convenient when the measurement results are used for the management and the control of the exposure process. The expression using shape parameters can be quantized by determining a shape model to fit a point string of cross-sectional shape data onto the model. In a situation in which, for example, a trapezoid model is employed, when the height is obtained by use of the minimum and maximum values of the height and straight-line fitting is conducted for a data string of each of the left and right sidewall sections excepting partial data of the upper and lower sections, it is possible to acquire the inclination angle of the sidewall and the top and bottom corner coordinates. When data expressed using the shape models and parameters as above is stored in the simulation library together with the waveform data, the cross-sectional shape obtained based on the matching results can be expressed by use of practical numeric values.

The library can be created by recording combinations of the cross-sectional shapes and the SEM signal waveforms obtained as above, together with exposure process parameters such as the exposure energy and focus value, the dimensions of particular heights such as the bottom and top heights or together with parameters using models of simple shapes. In the library, although the shape models are expressed using exposure condition parameters; also, there are included at the same time parameters directly representing shapes.

Next, description will be given of a method to estimate the exposure condition and the pattern shape of the measurement target pattern by use of the library created as above by referring to FIG. 3(c). In step S0010, after producing an SEM image of the measurement target pattern, a waveform profile of the SEM signal is extracted from the image. By detecting a line pattern waveform position in the SEM image 012 of FIG. 3(c), the signal waveform of the line pattern section (the section enclosed by a rectangle in FIG. 3(c)) is obtained as numeric data. In this situation, if the image has not an appropriate S/N, the measurement will be efficiently stabilized by executing processing to average a plurality of scan data items. For a simple line pattern, it is solely necessary to conduct the averaging for a plurality of scanning operations. The SEM signal waveform 013 of the actual image obtained in this way is compared with a plurality of SEM simulation waveforms stored in the library, to thereby select an SEM simulation waveform having the highest agreement degree in the library.

For the agreement degree calculation, it is only necessary that the difference is obtained between the actual image and the simulation signal waveform data to conduct the evaluation by using the sum of the absolute or square values of the difference for all pixels (it can be determined in this example that the smaller the value is, the higher the agreement degree is). In this situation, for the x-directional offset between the image and the simulation data, the positioning is conducted by obtaining the amount of shift for which the agreement degree takes the highest value. Using the information of the agreement degree calculated in this fashion, there is calculated a data set having the highest agreement degree in the library. As a result, it can be estimated that the cross-sectional shape as the input of the waveform simulation set is the actual pattern cross-sectional shape and the exposure parameters to create the cross-sectional shape are the exposure condition at creation of the pattern. In this situation, whether or not the agreement degree is the highest value is judged; if it is other than the highest value, the exposure condition parameter set is updated and a waveform is again calculated for the new shape to execute the matching processing such that the processing is repeatedly executed until it is judged that the agreement degree is the highest value. When the exposure condition parameters for which the agreement degree is the highest value are determined, the results are outputted, to thereby terminate the matching processing. The repetitive operation of the matching to estimate the exposure condition parameters for which the agreement degree is the highest value can be implemented by applying a general nonlinear optimization scheme such as the Levenberg-Marquardt method. Incidentally, the simulation data takes discrete values for the exposure condition parameters; however, by conducting interpolation between the simulation data items, it is possible to estimate a simulation waveform using an exposure condition parameter for which no simulation result is present. For the simulation waveform interpolation, it is only necessary to use a method disclosed in, for example, J. S. Villarrubia, A. E. Vladar, J. R. Lowney, and M. T. Postek, "Edge Determination for Polycrystalline Silicon Lines on Gate Oxide," Proc. SPIE 4344, pp. 147-156 (2001).

In the library matching method disclosed in non patent literatures 1 to 3, the matching is conducted independently for the left and right edges; however, in the matching according to the present embodiment, there is selected a pattern for which the matching is obtained for both of the left and right edges; hence, the matching is carried out by use of the overall waveform. This is because that the exposure pattern does not necessarily have a symmetric left-right shape depending on the mask layout; in such situation, the relationship between the left and right pattern shapes is also an important feature which changes depending on exposure process parameters; hence, the matching is carried out using the relationship. When symmetry exists between the left and right edges, it is naturally possible to calculate the waveform of only either one side for use. By conducting the matching between the actual image and the simulation library in this way, it is possible to estimate the exposure condition, the cross-sectional shape, and the dimensions of the measurement target pattern.

Figure 4:
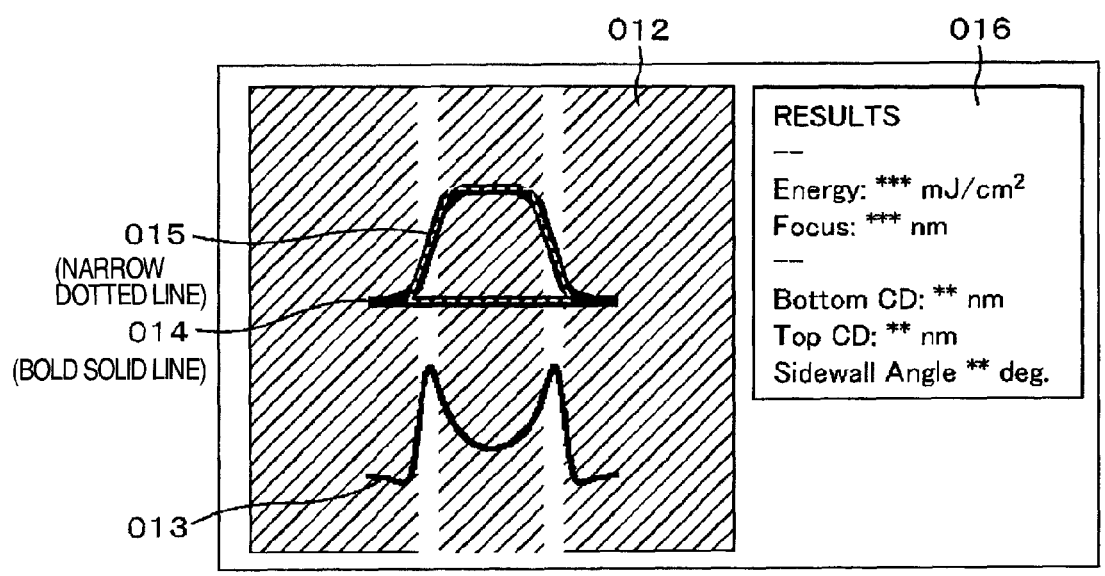
FIG. 4 is an explanatory diagram to explain a method of producing library matching results.

FIG. 4 shows an output example of the estimation results. An SEM signal waveform 013 is displayed over the SEM image 012. Also, by displaying the estimated cross-sectional shape together with the displayed signal waveform, the estimation results can be easily confirmed. In the example of FIG. 4, a solid line shows an estimated cross-sectional shape 014 obtained by an exposure simulator and a fine dotted line shows a shape obtained through the fitting by use of a simple model (a trapezoid in this situation). In this case, the display operation is conducted such that the x coordinates of the edge obtained using the matching results match the SEM image 012 and the SEM signal waveform 013. It is naturally possible that the simulation waveform selected through the matching is superimposed in the display. Also, the estimated results are displayed as numeric values in a measurement result display area 016. These numeric data items may also be outputted to a text file and the like.

In the present embodiment, an example including only the exposure energy quantity and focus value is shown for simplicity; however, in addition, data obtained by changing the resist sensitivity characteristic and the like may also be included in the library (in such situation, a multi-dimensional space equal to or more than three dimensions will be employed). Another embodiment using parameters other than the exposure energy quantity and focus value will be described in conjunction with a third embodiment.

As described by referring to FIGS. 1 to 4, in the pattern measuring method described above, by using, as a shape model, the cross-sectional shape information calculated through the exposure simulation, it is possible to appropriately express complicated shape variations of a resist pattern. By use of such appropriate cross-sectional shape model, through comparison between the SEM simulation waveform and the actual SEM image, high-precision measurement is possible in consideration of physical phenomena associated with electron beam radiation such as influence from scattering of electrons inside and outside the measurement target pattern and influence from the cross-sectional shape of the pattern.

Further, by expressing the cross-sectional shape calculated through the exposure simulation, by using exposure condition parameters; a complex shape can be represented using a small number of simple parameters; as a result, the problem of uniqueness of the solution in the library matching can be solved, and stable and high-speed measurement is possible. Moreover, through the library matching, it is possible to estimate the cross-sectional shape and the dimensions as well as the exposure condition parameters; hence, information efficient also for the management and control of the exposure process can be obtained.

For the pattern cross-sectional shape measuring scheme, due to increasingly finer semiconductor patterns, it is quite difficult to obtain required precision. Particularly, the resist pattern measurement has many problems; in the crosssection observation by an SEM, a TEM, and the like, the resist damage due to electron beam radiation has exceeded an ignorable level. It is difficult for the atomic force microscope to obtain sufficient precision due to the limit of the dimensions of the probe. Further, scatterometry as an optical scheme is a scheme capable of estimating a cross-sectional shape; however, to obtain sufficient precision, it is required to measure a cross-sectional shape by use of another measuring unit to calibrate models and parameters. The cross-sectional shape estimation scheme using the SEM library matching can also be used for the scatterometry calibration.

Embodiment 2

Next, description will be given of a method of evaluating the exposure simulation by use of the library matching method of the first embodiment. In the first embodiment, it is assumed that the exposure process simulation has been calibrated to match the actual sample in advance; however, actually, the calibration of the exposure process simulation itself also has many problems. Particularly, since there does not exist an effective unit to correctly measure the resist pattern cross-sectional shape at a high speed and at a low cost, the calibration of the exposure process simulation is difficult. In this regard, for the second embodiment, description will be given of a method of evaluating and adjusting the exposure process simulation by using the pattern shape measuring and dimension determining method through the library matching described in conjunction with the first embodiment.

For the first embodiment, description has been given of a situation to measure a pattern for which the exposure condition variation quantity is unknown; for the second embodiment, there is created an FEM wafer in which a plurality of shots are formed by changing the exposure energy and focus value, and then matching processing similar to that of the first embodiment is executed for each chip on the FEM wafer. If the exposure simulation appropriately matches the actual exposure state, the measurement result also matches the simulation result; however, if they do not match each other, the mismatch state represents the difference between the exposure simulation and the actual pattern. In this regard, description will be given of a method of adjusting the exposure simulation parameters by evaluating the mismatch between this simulation and the actual pattern by referring to FIG. 5.

First, an exposure condition to be adjusted is set (FIG. 5(a)). Next, an exposure simulation is conducted in a parameter range wider than the exposure condition thus set, and then an SEM simulation is conducted using a cross-sectional shape as the result of the exposure simulation, to thereby create a library (FIG. 5(b)). On the other hand, an actual wafer is exposed under an exposure condition set in advance to create patterns (FIG. 5(c)), and then library matching is conducted for the created pattern of each shot. As shown in (FIG. 5(d)), if the exposure simulation has not been fully calibrated, the estimated exposure energy and focus values differ from the setting values set in FIG. 5(a). The quantity of difference is an index of the disagreement between the exposure simulation and the actual pattern. For example, by obtaining the mean value and the dispersion for the quantity of difference between the estimated values and the setting values of the exposure energy and focus values in the overall FEM, it is possible to obtain index values corresponding to the exposure condition parameter offset and distortion. In this situation, if the data set resultant from the exposure process simulation calculated in FIG. 5(b) fully includes shapes corresponding to actual patterns, the cross-sectional shape can be correctly estimated although difference appears in the exposure condition parameters. It is possible to judge appropriateness of the cross-sectional shape set of the library by use of the agreement degree of the library matching. If the shape has been correctly estimated, it is only necessary to adjust the exposure simulation by using the shape information. FIG. 5(e) shows an example of data to be used in the adjustment. The exposure condition parameter is represented along the abscissa and the shape or dimension parameter is represented along the ordinate; and the exposure simulation results and the estimation results through the library matching are plotted. In the example of FIG. 5(e), the exposure energy E is represented along the abscissa and the line width is represented along the ordinate. In this example, it can be seen that the sensitivity of the dimension variation with respect to the exposure energy variation is higher in the actual patterns than in the simulation. If such information is obtained, it can be judged that it is only necessary to adjust the parameter of the resist sensitivity. The measurement result of the actual pattern shape has been obtained; hence, when the exposure simulation adjustment is repeatedly conducted by changing the exposure simulation parameters, it is not required to again create the actual pattern. Through the adjustment, when the exposure process parameters are appropriately set, the high-precision and stable measurement can be implemented as in the first embodiment by employing the library using the results of the exposure process simulation conducted under the obtained condition.

Moreover, if the cross-sectional shape set is not appropriate, it is required to evaluate and to adjust exposure condition parameters other than the energy and the focus. Details will be described in conjunction with a third embodiment.

Figure 5:
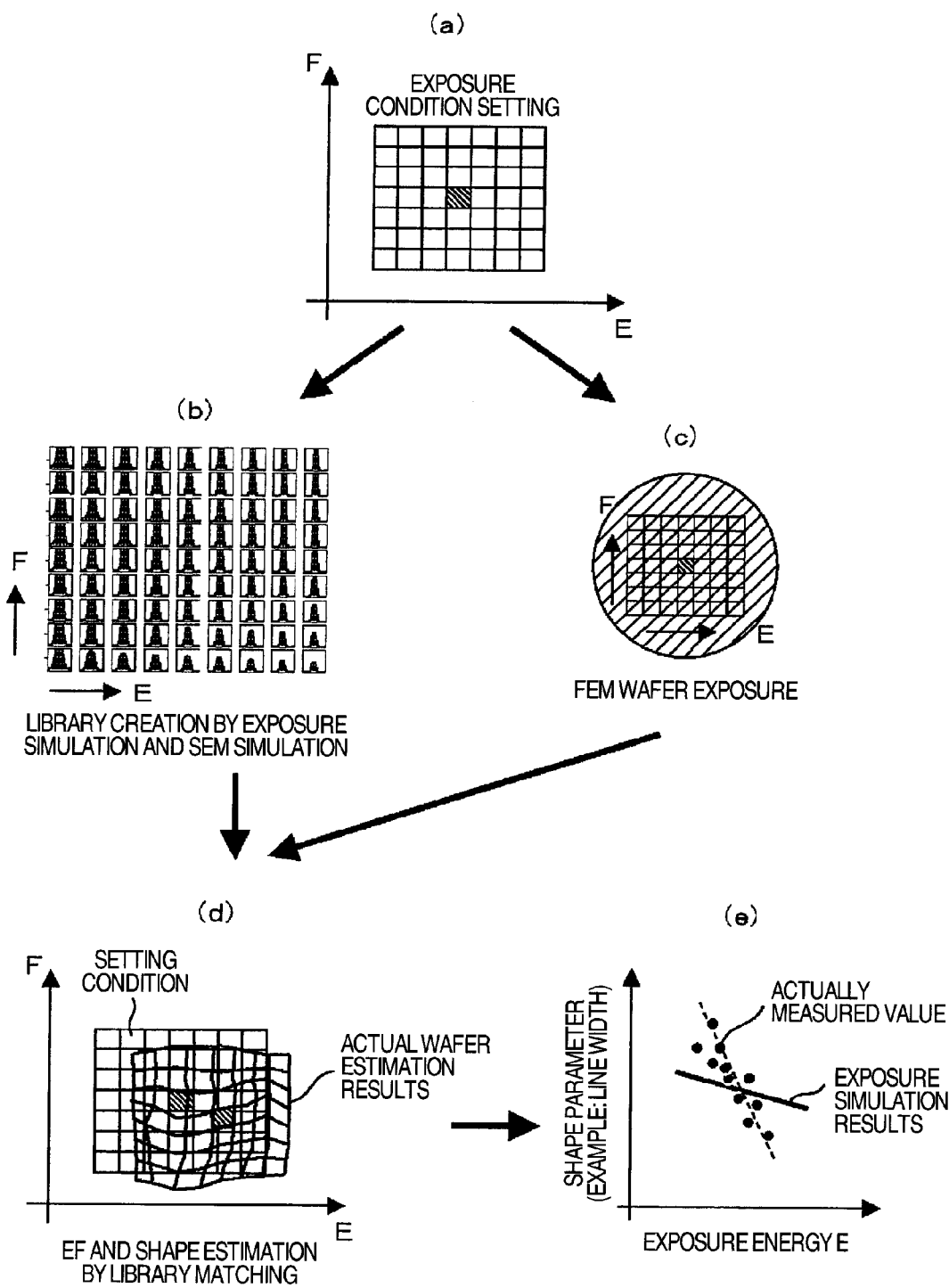
FIG. 5 is an explanatory diagram to explain an exposure simulator evaluating and adjusting method using library matching results.

As described by referring to FIG. 5 above, due to the library matching, it is possible not only to conduct high-precision measurement of the pattern cross-sectional shape and dimensions, but also to quantitatively evaluate consistency of the exposure simulation and the actual pattern. This makes it possible to evaluate and to adjust the exposure simulation without destroying the wafer, and the precision of the exposure simulation can be improved. Further, by conducting the library matching by use of the results of the adjusted exposure simulation, the stable measurement can be conducted with high precision similar to that of the first embodiment.

Embodiment 3

Next, description will be given of another method of evaluating an exposure simulation by using the library matching method of the first embodiment. For the second embodiment, description has been given of a situation in which although the exposure process simulation is not sufficiently adjusted, the cross-sectional shape set resultant from the exposure simulation conducted by changing the exposure energy and focus parameters fully expresses pattern shapes to be actually formed in the exposure process (the agreement degree of the library matching is sufficiently high). However, there exist many parameters associated with the exposure process; particularly, chemical characteristic parameters such as those of resist materials are not easily fitted through experiments. The exposure energy and focus differences and the like are relatively easily modeled; however, for the adjustment of the photosentitizer diffusion length and surface anti-solubility parameters which determine resist characteristics, the PEB temperature and time, and development parameters representing and development characteristics, there is desired an easy pattern shape evaluation unit.

Description will be given of the third embodiment by referring to FIG. 6. In the second embodiment, the library is created only using the FEM for which the exposure energy and focus are changed, and then the matching is conducted; in the third embodiment, by changing exposure process parameters other than those above to create FEM data under the respective conditions. As shown in FIG. 6(a), the FEM library is created for the respective exposure process conditions, and then the matching is conducted with the actually exposed FEM wafer. For each exposure process parameter, a data set similar to that of FIG. 5(d) of the second embodiment is obtained; hence, by using the difference in the matching, an exposure process parameter most appropriate for the actual wafer is estimated. In FIG. 6(b), the exposure process parameter for the creation of each FEM is plotted along the abscissa and the library matching error for each condition is plotted along the ordinate. When the library created through the exposure simulation does not include an appropriate pattern shape, the matching error becomes greater; hence, it can be determined that the result of the exposure simulation using the exposure process parameter having the smallest matching error is most similar to the actual pattern. In this connection, based on the precision required for the shape measurement, the maximum matching error for which a reliable result is obtainable is determined in advance and is set as the reliability threshold value. If the matching error for each of the exposure process parameters is equal to or more than the reliability threshold value, it can be determined that these exposure process parameters do not include the appropriate parameter capable of expressing the actual process. In such situation, it can be recognized that it is required to cope therewith such that the range of the exposure process parameter is changed or other parameters are also adjusted. FIG. 6 shows an example using one parameter for simplicity; naturally, the operation may be conducted using a plurality of exposure process parameters.

As described by referring to FIG. 6 above, due to the library matching, it is possible not only to conduct high-precision measurement of the pattern cross-sectional shape and dimensions, but also to quantitatively evaluate consistency of the exposure simulation and the actual pattern. This makes it possible to evaluate and to adjust the exposure simulation without destroying the wafer, and it is hence possible to improve precision of the exposure simulation. Further, by conducting the library matching by use of the results of the adjusted exposure simulation, the stable measurement can be conducted with high precision similar to that of the first embodiment.

Embodiment 4

Figure 7:
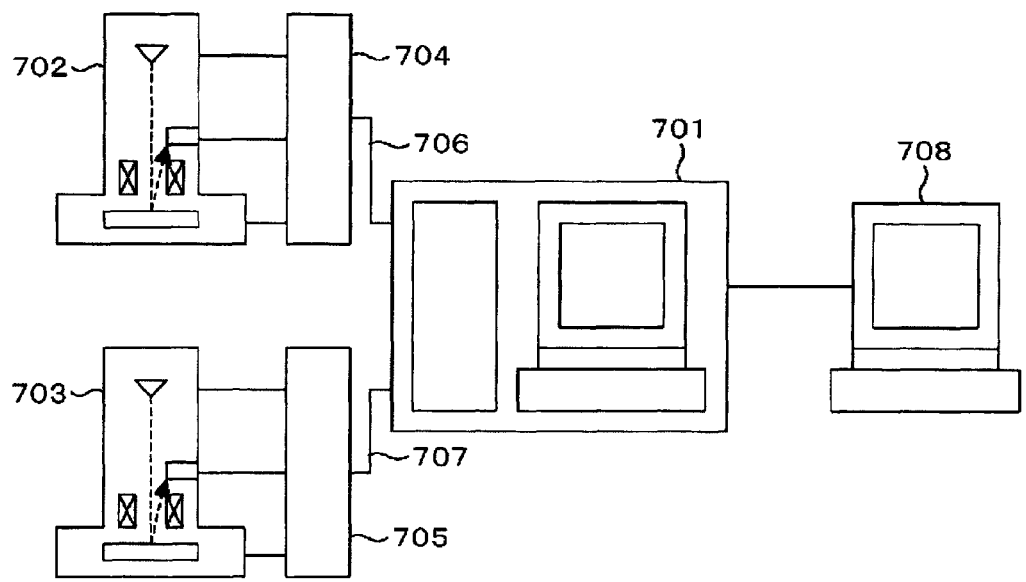
FIG. 7 is a diagram to explain an example of a measuring system including a plurality of SEMs.

FIG. 7 is a general configuration diagram of a measuring system to conduct exposure simulation, library data creation based on the exposure simulation, pattern measurement, and the like. The system exemplified in FIG. 7 is configured to include a data managing unit 701 as a central unit of the system and a plurality of SEMs connected thereto. The data managing unit 701 is connected to an SEM 702 to conduct pattern measurement and inspection for a photomask and a reticle and an SEM 703 to measure and to inspect patterns transferred onto the semiconductor wafer through the projection exposure using a photomask and the like. The SEMs 702 and 703 do not remarkably differ from each other in the basic configuration as an electron microscope; however, each thereof is configured to cope with the difference in size of the semiconductor wafer and the photomask and the difference in immunity against charge.

The respective SEMs 702 and 703 are connected to respective control units 704 and 705 to perform required control for the SEMs. In each SEM, an electron beam emitted from an electron source is focused through a plurality of stages of lenses, and the focused electron beam is used through a scanning deflector to perform one-dimensional or two-dimensional scanning on the specimen.

Secondary Electrons (SE) or Backscattered Electrons (B SE) emitted from the specimen by the electron beam scanning are detected by a detector and are stored in a storage medium such as a frame memory at timing synchronized with the scanning of the scanning deflector. Further, the scanning by the scanning deflector is possible for arbitrary sizes, positions, and directions, which makes it possible to conduct scanning to create an image and to selectively scan an edge section. Moreover, each of the SEM control units 704 and 705 includes a function to monitor states of the SEM such as a beam current and image resolution, and reflects the monitored results as device parameters in the matching between the SEM simulation result and the measurement target image, to thereby implement the stable measurement with high precision.

The control and the like described above are carried out by the respective SEM control units 704 and 705 such that the image and signal obtained as a result of the electron beam scanning and the monitored result of the control unit states are sent via communication lines 706 and 707 to the data managing unit 701. Incidentally, in the description of this example, the control units to control the SEMs are other than the data managing unit to conduct the measurement based on the signals obtained by the SEMs; however, this is not limitative, but it is also possible that the data managing unit conducts both of the unit control and the measurement processing or each control unit conducts the SEM control as well as the measurement processing.

Further, a program to execute the measurement processing is stored in the data managing unit or the control units in advance such that the measurement or arithmetic operation is conducted according to the program. Additionally, the library matching and the like described above are also conducted by the data managing unit or the control units.

Moreover, the design data of photomasks (to be simply referred to as masks depending on cases) and pattern layout which are used in semiconductor production processes are stored in the design data managing unit 701. The design data is represented, for example, in the GDS format or the OASIS format and is stored in a predetermined format. Incidentally, the design data may be in any format type only if the software to display the design data is capable of displaying the format and is capable of processing the design data as graphic data. In addition, it is also possible to store the design data in a storage medium disposed in addition to the data managing unit.

In addition, the data managing unit 701 is connected to a simulator 708. The simulator 708 integrally includes a program to create a pattern layout based on design data, semiconductor production process conditions, and the like stored in an external storage medium or the data managing unit 701 and an arithmetic unit to execute the program, and is configured to be capable of transmitting layout data after the simulation to the data managing unit. Incidentally, for the present embodiment, description will be given of an example in which the simulation is conducted in the simulator 708; this is however not limitative, but the simulation may be carried out by executing the program, for example, in the data managing unit 701.

Figure 8:
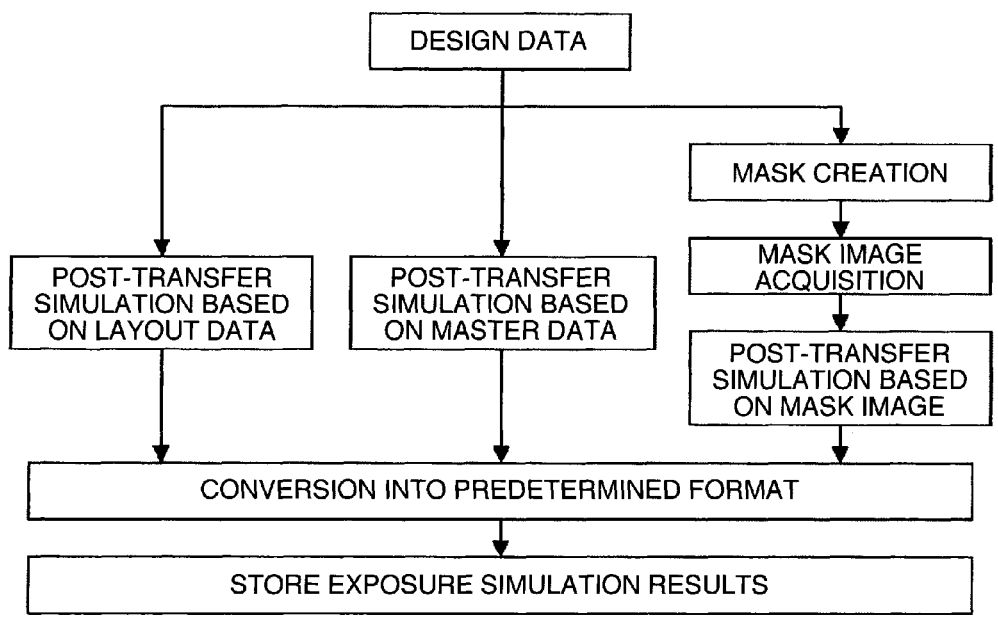
FIG. 8 is a diagram to explain a process of exposure simulation based on design data.

FIG. 8 is a diagram to explain a process of exposure simulation using the measuring system exemplified in FIG. 7. For the exposure simulation, three schemes are generally considerable as exemplified in FIG. 8. In the first scheme, the post exposure simulation is conducted based on the layout of the design data and various exposure conditions. In the second scheme, the simulation is conducted based on the photomask (mask) data to expose a pattern onto a semiconductor wafer and various exposure conditions. In the third scheme, an image of a mask actually created based on mask data is obtained by the SEM 702 to conduct the simulation based on the mask image. In the third example, a pattern edge of the mask image obtained by the SEM 702 is extracted to conduct the simulation based on a contour line of the extracted pattern edge.

The simulation is conducted by the simulator 708, and then the simulator 708 transmits the simulation result to the data managing unit 701. The data managing unit 701 creates the library based on the obtained simulation result. In this regard, it is also possible that the data managing unit 701 executes a program for the simulation such that the simulation and the library creation are carried out only by the data managing unit 701; further, the processing described above may also be executed by the control units 704 and 705 disposed for the SEMs.

Additionally, like the library creation and the calculation of the pattern shape and dimension may also be conducted by the data managing unit 701 and the control units 704 and 705. In this situation, the arithmetic units integrally disposed in these units function as processing sections for the shape selection, the dimension measurement, and the like.

The pattern measuring technique described above is applicable to any object for which a cross-sectional shape can be estimated through the production process simulation and the image acquisition and the simulation can be conducted by an electron microscope or a charged particle beam device similar thereto. Further, the description has been given of measurement of a pattern created through a semiconductor pattern exposure process; however, the technique is also applicable to MEMS, fine industrial parts, and the like.

Embodiment 5

Next, description will be given of an example in which a hot spot position on a specimen is determined through simulation and a library is selectively created for the hot spot. A hot spot is a position onto which a circuit pattern cannot be correctly transferred in the lithography process and is likely to be a defect. By monitoring such hot spot by a measuring and inspecting device such as a scanning electron microscope, the process condition is adjusted or a feedback operation is conducted for the design data. Such hot spot information is an indicator to determine a position for measurement and inspection using a scanning electron microscope or the like.

The cross-sectional shape of a pattern is likely to change according to the pattern layout shape and a relationship with respect an adjacent pattern; hence, depending on cases, it is favorable to create the cross-sectional shape library in consideration of these conditions. On the other hand, there can be considered various kinds of combinations between the pattern layout shapes and the relationships with respect to an adjacent pattern; hence, if the library is created for each of the relationship, there may be required a great amount of arithmetic processing.

In this regard, for the present embodiment, description will be given of a scheme in which measurement candidate points are extracted by conducting exposure simulation or the like and a cross-sectional shape library is selectively constructed for the candidate points, to thereby improve efficiency of the library creation.

Figure 9:
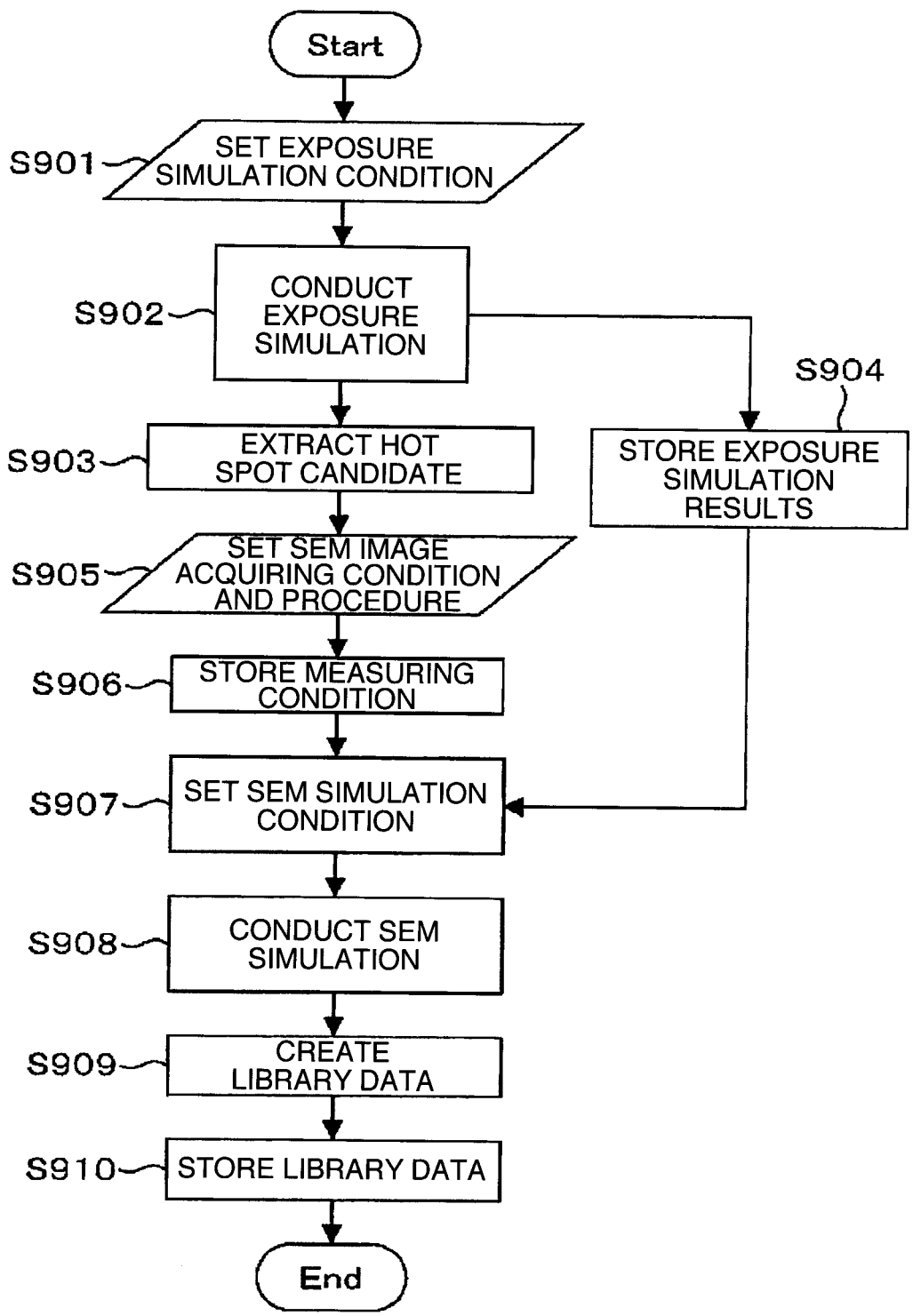
FIG. 9 is a flowchart to demonstrate a process to conduct library creation based on detection of a hot spot.

FIG. 9 is a flowchart to explain the processing process. First, the design data is read, and an exposure simulation condition is set for the design data thus obtained (step 901).

And the exposure simulation is conducted (step 902), hot spot candidates are extracted (step 903), and the exposure simulation result (cross-sectional shape) is stored in a predetermined storage medium (step 904). Incidentally, it is also possible that the exposure simulation in step 902 is conducted not to obtain a cross-sectional shape, but to obtain a change in the two-dimensional shape of the pattern. It is also possible to conduct another simulation in which hot spots are extracted based on the two-dimensional shape evaluation to selectively obtain cross-sectional shapes for the associated locations.

Next, an SEM measuring condition is set (step 905). The SEM measuring condition includes electron microscope optical conditions, for example, the measuring magnification factor (view field size) and electron beam arrival energy arriving at the specimen. The measuring condition is stored as a measuring recipe (step 906). Next, based on the SEM measuring condition thus set, a simulation condition is set to calculate an SEM image (step 907). Based on the simulation condition, the simulation is executed (step 908), to create library data based on the simulation result (step 909). Finally, the created library data is stored in a predetermined storage medium (step 910).

Through the steps above, it is possible to efficiently create a library for the multipoint measurement.

Reference Signs List
001 Exposure process simulation result
002 Simulation waveform library
003 SEM device
010 Exposure process simulation result (cross-sectional shape)
011 SEM simulation result (signal waveform)
012 SEM image
013 SEM signal waveform
014 Estimated cross-sectional shape (exposure simulation result)
015 Estimated cross-sectional shape (approximated shape by simple model)
016 Measurement result display section

The invention claimed is:

1. A pattern measuring device for selecting pattern information by referring to a library having stored pattern information created based on charged particles emitted from a specimen and information regarding pattern shapes with a relationship established therebetween, comprising:

a processing section for referring, with respect to waveform information obtained based on radiation of a charged particle beam onto a specimen, to a library having stored a plurality of pattern information pieces formed based on simulation under different process conditions and information regarding a plurality of pattern information with a relationship established therebetween, and for thereby selecting information regarding a pattern shape stored in the library, wherein the processing section is arranged to obtain a first relationship between a change of the process conditions and a change of the pattern information in accordance with waveform information to be obtained by the radiation of the charged particle beam onto the specimen, and to obtain a second relationship between the first relationship and a change of the pattern information and the process conditions to be obtained by a simulation.

2. The pattern measuring device according to claim 1, wherein the library has stored pattern exposure process conditions and the waveform information with a relationship established therebetween.

3. A pattern measuring device for selecting pattern information by referring to a library having stored pattern information created based on charged particles emitted from a specimen and information regarding pattern shapes with a relationship established therebetween, comprising:

a processing section for referring, with respect to waveform information obtained based on radiation of a charged particle beam onto a specimen, to a library having stored a plurality of pattern information pieces formed based on simulation under different process conditions and information regarding a plurality of pattern information with a relationship established therebetween, and for thereby selecting information regarding a pattern shape stored in the library, wherein the processing section is arranged to prepare a library for storing a plurality of waveform information to be obtained through simulations under exposure conditions different from each other, the simulation being made in accordance with radiation of the charged particle beam onto a specimen, and to determine a plurality of matching errors of each of the process conditions by comparing each of the plurality of waveform information with waveform information having been stored in another library.

4. The pattern measuring device according to claim 3, wherein the library has stored pattern exposure process conditions and the waveform information with a relationship established therebetween.

* * * * *